United States Patent
Chuang et al.

(10) Patent No.: US 9,894,783 B2
(45) Date of Patent: Feb. 13, 2018

(54) ELECTRONIC DEVICE HAVING AN ELASTIC MEMBER

(71) Applicant: FOXCONN INTERCONNECT TECHNOLOGY LIMITED, Grand Cayman (KY)

(72) Inventors: Shun-Jung Chuang, New Taipei (TW); Chiang-Nan Hung, New Taipei (TW); Hao-Chang Zhang, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/209,704

(22) Filed: Jul. 13, 2016

(65) Prior Publication Data
US 2017/0020016 A1    Jan. 19, 2017

(30) Foreign Application Priority Data

Jul. 13, 2015 (TW) .............................. 104122582 A

(51) Int. Cl.
*H05K 5/00* (2006.01)
(52) U.S. Cl.
CPC .................. *H05K 5/0021* (2013.01)
(58) Field of Classification Search
CPC ..... H05K 5/0256; H05K 5/0021; G06F 1/187
See application file for complete search history.

(56) References Cited

U.S. PATENT DOCUMENTS

| 6,894,893 | B2 * | 5/2005 | Hidesawa | G06F 1/1616 361/679.55 |
| 7,106,596 | B1 * | 9/2006 | Reznikov | G06F 1/185 312/223.1 |
| 7,724,533 | B2 * | 5/2010 | Tanaka | G06F 1/1616 361/752 |
| 7,817,003 | B2 | 10/2010 | Fullerton et al. | |
| 7,999,645 | B2 | 8/2011 | Sarda | |
| 2005/0174730 | A1 * | 8/2005 | Chen | H05K 7/1487 361/679.35 |
| 2006/0171110 | A1 * | 8/2006 | Li | G06F 1/184 361/679.37 |
| 2009/0097196 | A1 * | 4/2009 | Peng | G06F 1/187 361/679.34 |
| 2015/0288422 | A1 | 10/2015 | Fishman et al. | |

FOREIGN PATENT DOCUMENTS

| TW | M287506 | 2/2006 |
| TW | M288154 | 3/2006 |
| TW | M335040 | 6/2008 |

* cited by examiner

*Primary Examiner* — Hung Dang
(74) *Attorney, Agent, or Firm* — Wei Te Chung; Ming Chieh Chang

(57) ABSTRACT

An electronic device includes a framework having a number of ribs to define a number of receiving grooves therebetween, a number of modules detachably received in the receiving grooves, and a pair of elastic members mounted to a respective module. Each receiving groove has a pair of apertures in the ribs. Each of the modules has a pair of through holes. Each of the elastic members includes a protrusion extending through the through hole toward a corresponding rib and a leg resiliently urging the protrusion to fit into a corresponding aperture.

4 Claims, 10 Drawing Sheets

ELECTRONIC DEVICE HAVING AN ELASTIC MEMBER

BACKGROUND OF THE INVENTION

1. Field of the Invention

The present disclosure relates generally to an electronic device, and more particularly to an electronic device having an elastic member.

2. Description of Related Arts

U.S. Patent Application Publication No. 20150288422 discloses a system for enabling a chassis-coupled modular mobile electronic device. The system includes a modular electronic device enablement system, a set of module couplers, and a chassis. The module couplers preferably couple modules mechanically to the chassis. The module couplers may have detents or structures that resist movement of the modules when they are fully coupled, including spring-loaded balls mounted on a surface of the module that fits into corresponding shallow holes on a complementary surface of the module coupler. The module coupler may also retain the module using a latching mechanism, e.g., a pin that when extended prevents the module from being removed (the pin would be retracted to remove the module), or a snap latch that holds the module tight against the contact surfaces of the module coupler when engaged.

An improved electronic device is desired to compensate for the defects in the previous technology.

SUMMARY OF THE INVENTION

Accordingly, an object of the present invention is to provide an electronic device having an improved elastic member.

To achieve the above object, an electronic device comprises a framework having a plurality of ribs to define a plurality of receiving grooves therebetween, a plurality of modules detachably received in the receiving grooves, and a pair of elastic members mounted to a respective module. Each receiving groove has a pair of apertures in the ribs. Each of the modules has a pair of through holes. Each of the elastic members comprises a protrusion extending through the through hole toward a corresponding rib and a leg resiliently urging the protrusion to fit into a corresponding aperture.

Other objects, advantages and novel features of the invention will become more apparent from the following detailed description when taken in conjunction with the accompanying drawings.

DETAILED DESCRIPTION OF THE PREFERRED EMBODIMENT

Figure 1:
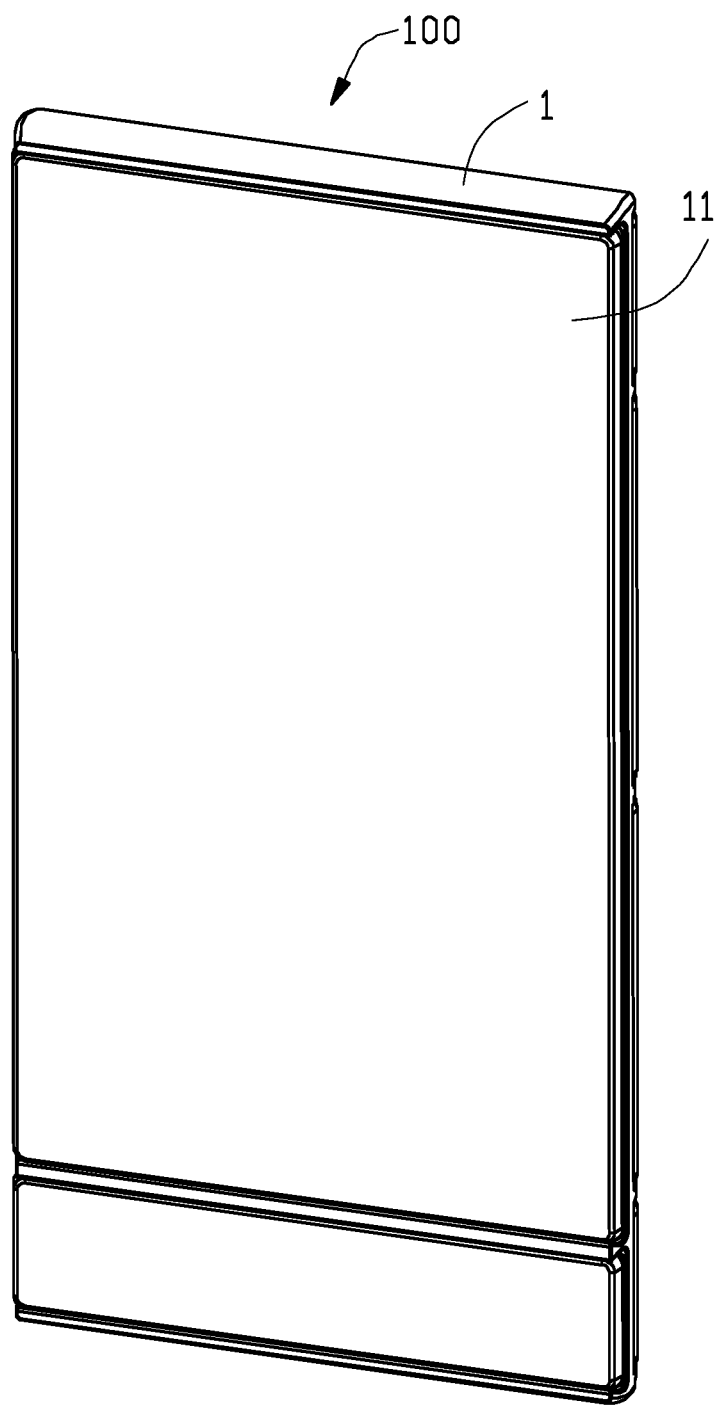
FIG. 1 is a perspective, assembled view of an electronic device of the present invention.
Figure 2:
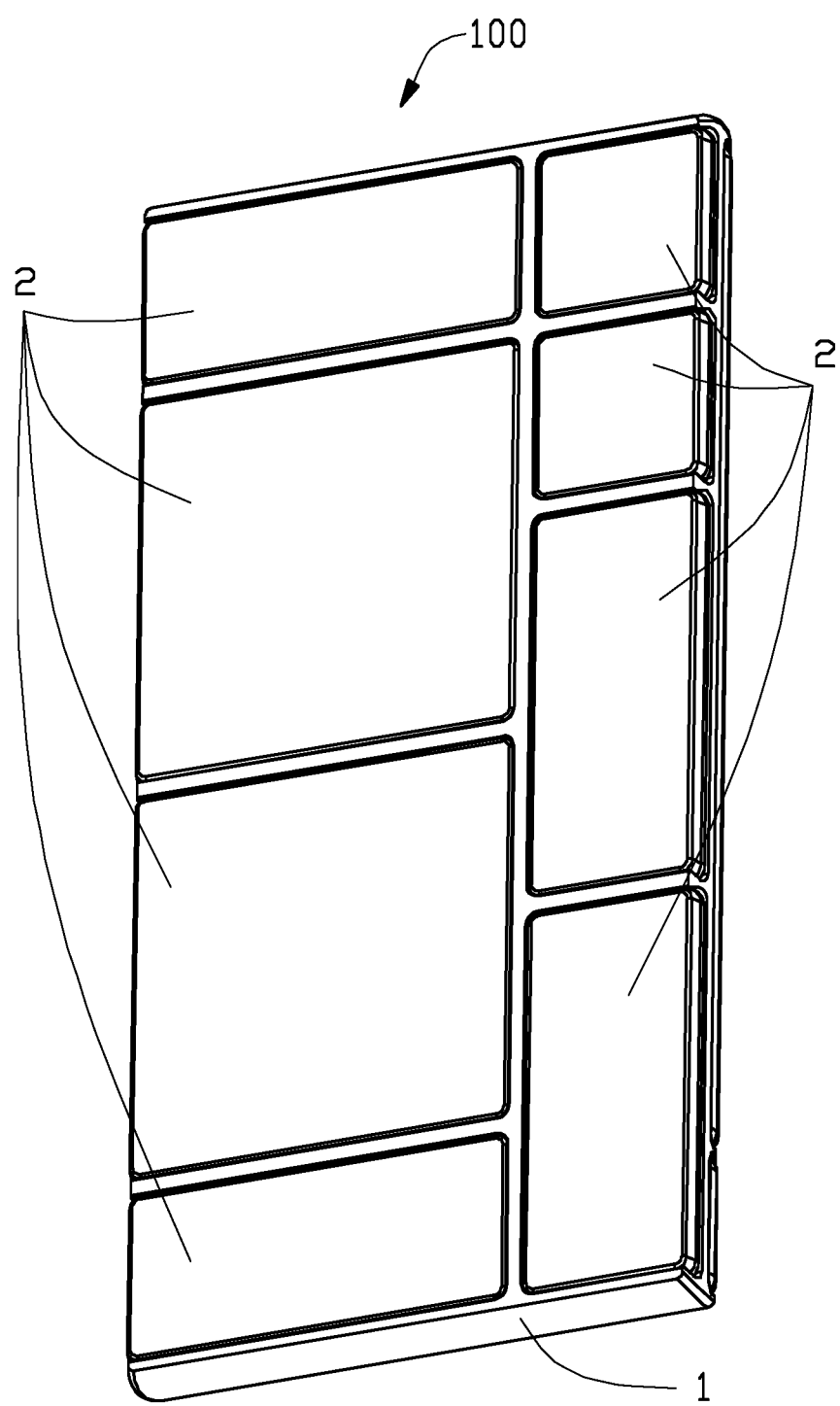
FIG. 2 is another view of the electronic device taken from FIG. 1.

Reference will now be made in detail to the preferred embodiment of the present invention.

Referring to FIGS. 1 to 5, the electronic device 100 of the first embodiment includes a framework 1, a number of modules 2 detachably assembled on the framework 1 and an elastic member 3 used for fixing the framework 1 and the modules 2. The framework 1 extends in horizontal plane and defines a longitudinal direction and a transverse direction perpendicular to the longitudinal direction. The modules 2 are assembled to the framework 1 along the transverse direction, and the modules 2 are detached from the framework 1 along the transverse direction.

Referring to FIGS. 1 to 4, the framework 1 defines an upper surface 11 and a lower surface 12 positioned oppositely to the upper surface 11. The upper surface 11 has a large panel slot 111 reserved for screen. The lower surface 12 defines a plurality of ribs 121 to define a plurality of receiving grooves 122 for receiving the modules 2. The framework 1 defines a pair of apertures 1221 on the ribs 121 of each receiving groove 122.

Figure 3:
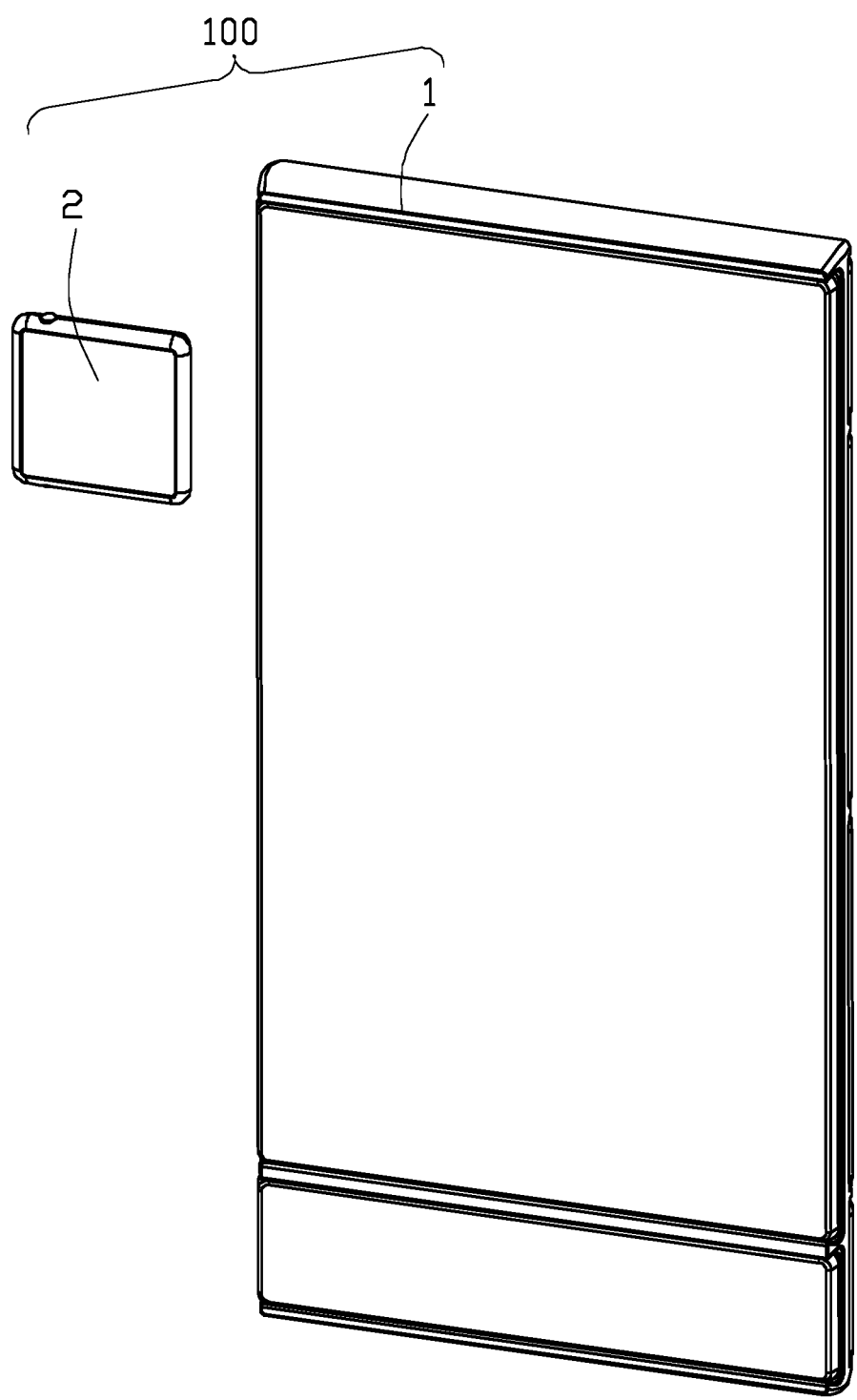
FIG. 3 is a partial perspective, exploded view of the FIG. 1.
Figure 4:
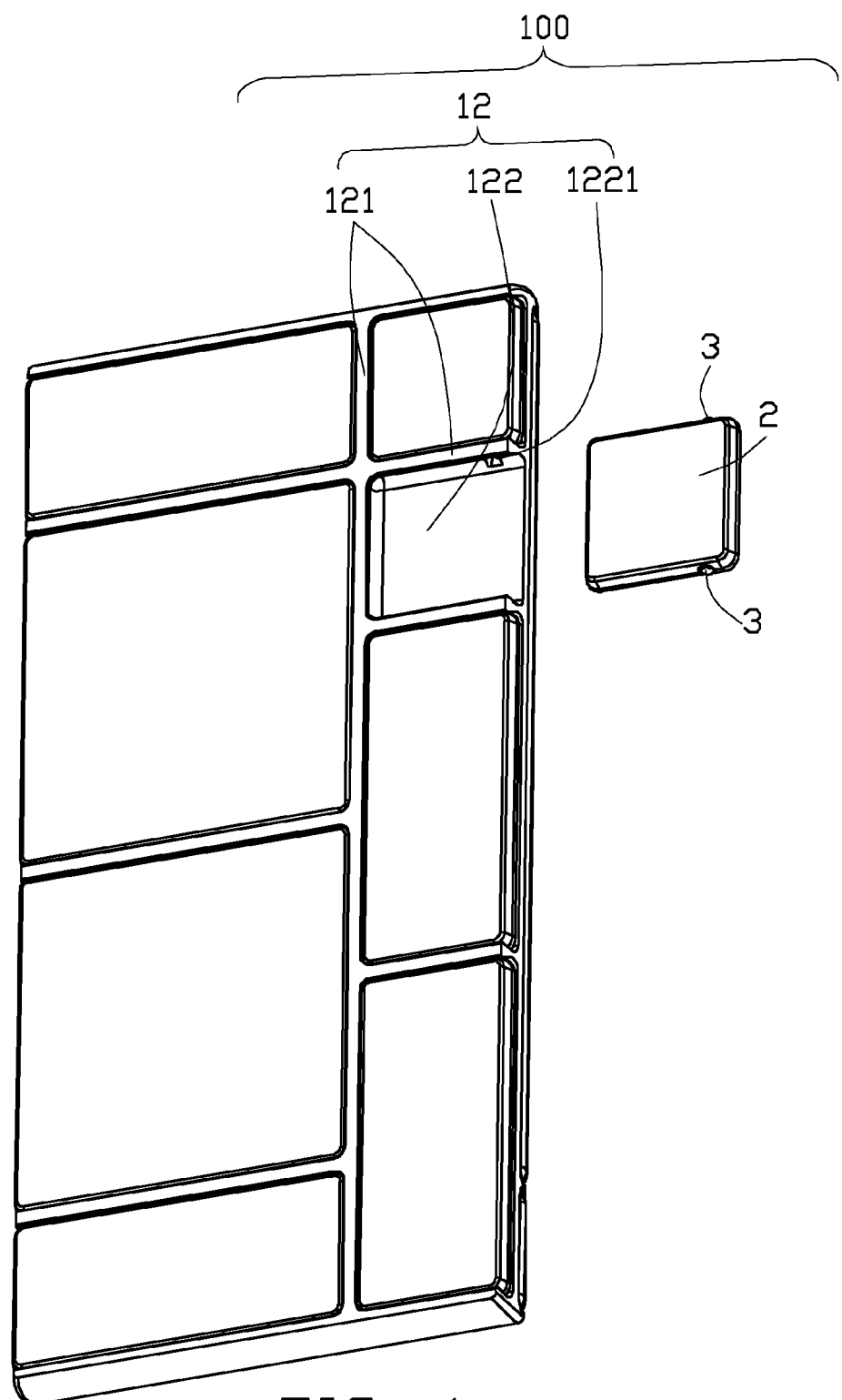
FIG. 4 is another view of the electronic device of FIG. 3.
Figure 5:
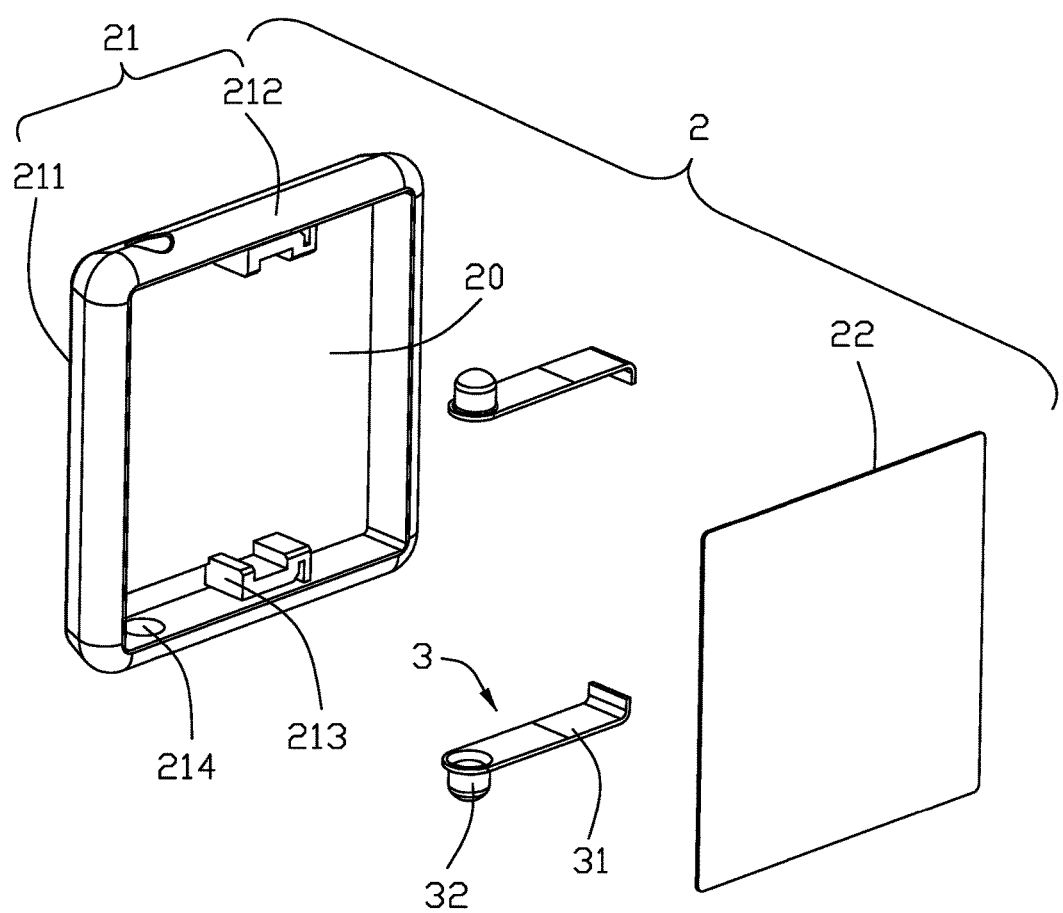
FIG. 5 is a perspective, exploded view of the module of the first embodiment of the electronic device.

Referring to FIGS. 3 to 5, the modules 2 have different sizes. Each module 2 includes a housing 21 acted as a box-shaped and a shielding shell 22 covering the housing 21 and forming a receiving room 20. The housing 21 defines a bottom wall 211 and a pair of opposite sidewalls 212 extending vertically from the bottom wall 211. The housing 21 comprises a pair of latching blocks 213 protruding from the pair of opposite sidewalls 212 and a pair of through holes 214 besides the corresponding latching block 213.

Referring to FIG. 5, each elastic member 3 acts as a cantilever beam and includes a leg/beam 31 and a protrusion 32 integrally located at one end of the leg 31. The legs 31 are arranged with the latching blocks 213. The protrusions 32 extend out from the through holes 214 of the modules 2. The leg 31 resiliently urges the protrusion 32 to fit into the aperture 1221 for fixing the module 2 to the framework 1. The protrusion 32 is movable along a longitudinal direction when engaging with the through hole 214. The electronic device 100 receives a click feeling during assembling. When the modules 2 are detached from the framework 1, the retention force between the framework 1 and the modules 2 need to be overcome. The protrusions 32 slide from the apertures 1221.

Figure 6:
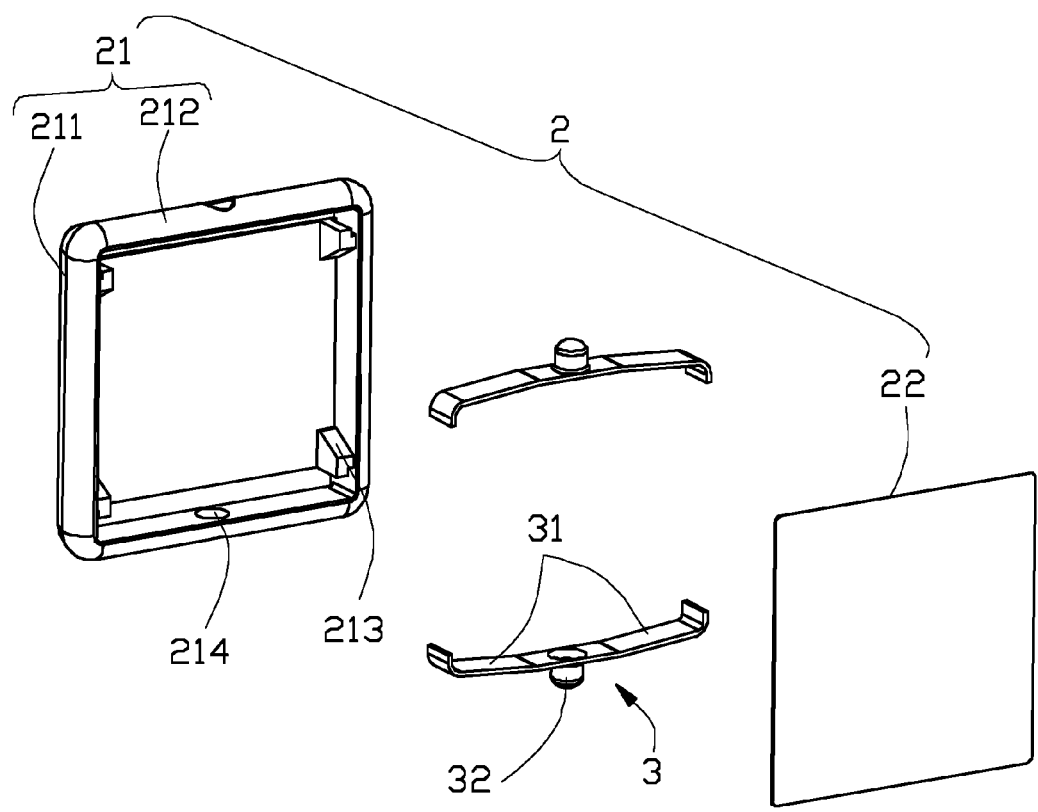
FIG. 6 is a perspective, exploded view of the module of the second embodiment of the electronic device.

Referring to FIG. 6, the electronic device 100 of the second embodiment differs from the first embodiment. The modules 2 include two pairs of opposite sidewalls 212 and the latching blocks 213 protruding from one pair of the opposite sidewalls 212. The through holes 214 are located at the other pair of opposite sidewalls 212. Each elastic member 3 acted as a freely supported beam includes a pair of legs 31 and a protrusion 32 integrally located at a middle of the legs 31. The legs 31 are engaging with the latching blocks 213. The protrusions 32 extend out from the through holes 214 of the modules 2.

Figure 7:
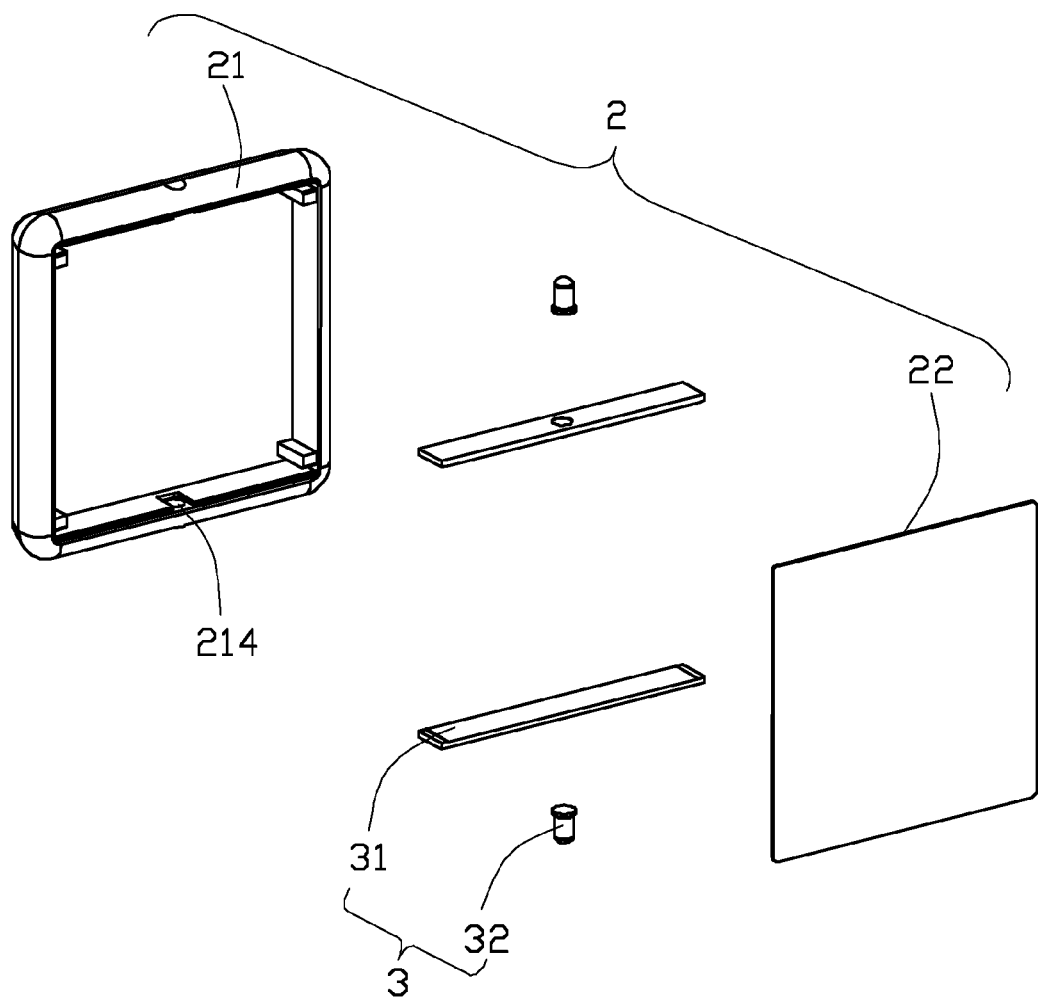
FIG. 7 is a perspective, exploded view of the module of the third embodiment of the electronic device.
Figure 8:
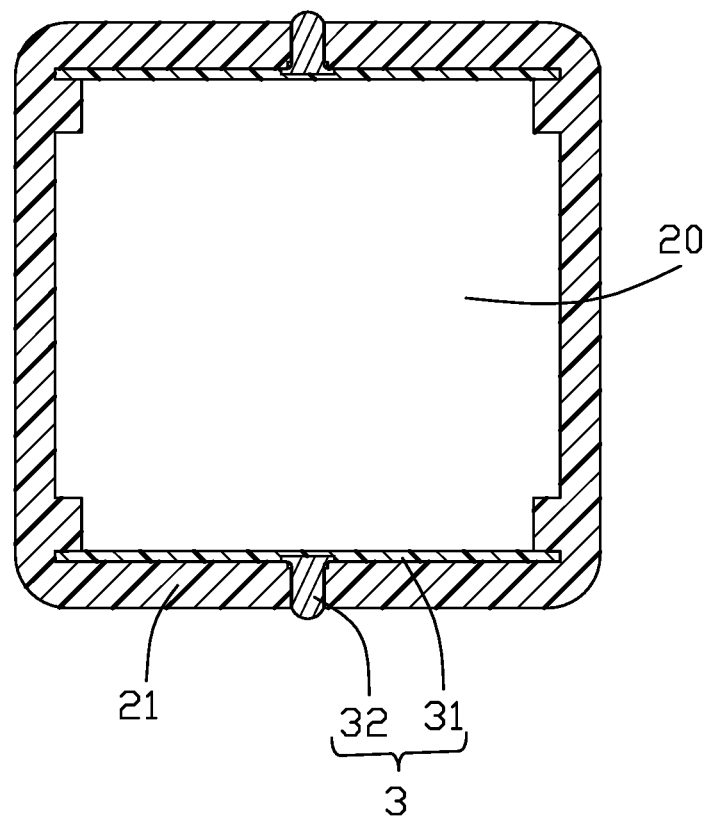
FIG. 8 is a cross-sectional view of the module of the electronic device taken from FIG. 7.
Figure 9:
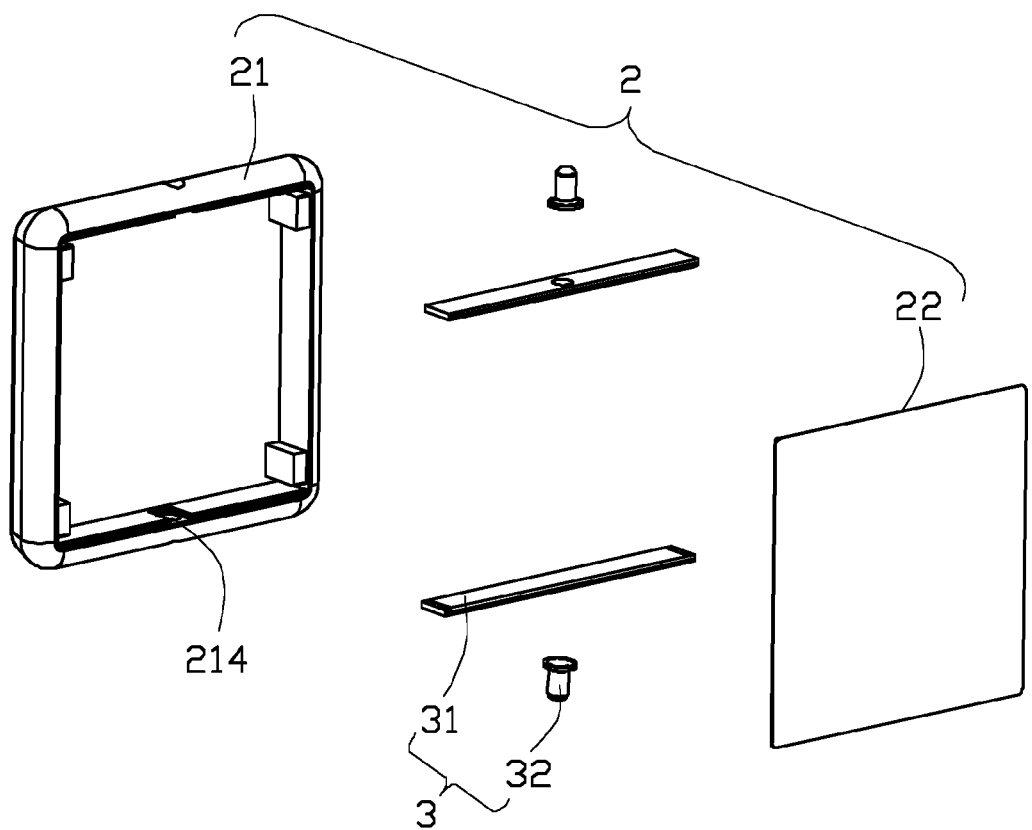
FIG. 9 is a perspective, exploded view of the module of the forth embodiment of the electronic device.
Figure 10:
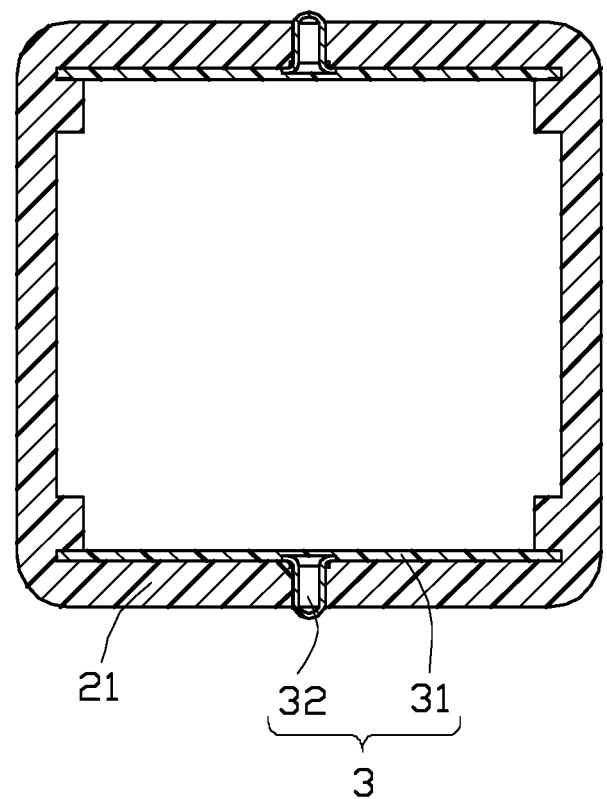
FIG. 10 is a cross-sectional view of the module of the electronic device taken from FIG. 9.

FIGS. 7 and 8 show an electronic device 100 of a third embodiment; FIGS. 9 and 10 show an electronic device 100 of a fourth embodiment. In the third and fourth embodiments, different from the first and second embodiments, the protrusions 32 are separated from the legs 31. The difference between the third embodiment and the forth embodiment is that the protrusions 32 of the third embodiment are formed by machining and the protrusions 32 of the fourth embodiment are stamped and drawn.

In the process of assembling the modules 2 to the framework 1, the protrusions 32 have displacement relative to the through holes 214 along the longitudinal direction. When the electronic device 100 demands to update, the individual module 2 with corresponding function is capable to be replaced. When detaching the modules 2 from the framework 1, the retention between the modules 2 and the framework 1 needs to be overcome. In this embodiment, the vertical cross-section of the module 2 is compliant with that of the receiving groove 122 so that the module 2 is only allowed to be assembled into the corresponding receiving groove 122 in a horizontal direction without risks of being dropped off therefrom in the vertical direction perpendicular to the horizontal direction after assembled even though the framework 1 upwardly exposes the module 2 to an exterior in the vertical direction.

While some embodiments in accordance with the present invention have been shown and described, equivalent modifications and changes known to persons skilled in the art according to the spirit of the present invention are considered within the scope of the present invention as described in the appended claims.

What is claimed is:

1. An electronic device comprising: a framework having a plurality of ribs to define a plurality of receiving grooves, each receiving groove being exposed to an exterior in a first horizontal direction and a vertical direction perpendicular to each other, and further having a pair of apertures in the ribs; a plurality of modules being configured to be adapted to be only horizontally assembled into the receiving grooves, each of the modules having a pair of through holes; and a pair of elastic members mounted to the respective module, each of the elastic members comprising a protrusion extending through the through hole toward a corresponding rib to fit into a corresponding aperture in a floating manner in a second horizontal direction perpendicular to both said first horizontal direction and said vertical direction; wherein said protrusion is constantly urged by a resilient beam in said second horizontal direction.

2. The electronic device as claimed in claim 1, wherein said protrusion is located at a middle region of the resilient beam along the first horizontal direction.

3. The electronic device as claimed in claim 1, wherein said beam extends along the first horizontal direction.

4. The electronic device as claimed in claim 1, wherein said protrusion is located at a front end of the beam in the first horizontal direction.

* * * * *